United States Patent
Yanagita et al.

(10) Patent No.: US 6,629,539 B1
(45) Date of Patent: Oct. 7, 2003

(54) SAMPLE PROCESSING SYSTEM

(75) Inventors: Kazutaka Yanagita, Yokohama (JP);
Kazuaki Ohmi, Yokohama (JP);
Kiyofumi Sakaguchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/434,663

(22) Filed: Nov. 5, 1999

(30) Foreign Application Priority Data

Nov. 6, 1998 (JP) .......................................... 10-316577

(51) Int. Cl.[7] ................................................ B08B 3/02
(52) U.S. Cl. ........................ 134/78; 134/80; 134/134; 134/148; 134/153; 134/902
(58) Field of Search ............................. 134/66, 68, 78, 134/80, 133, 134, 200, 902, 140, 148, 147, 149, 153, 157

(56) References Cited

U.S. PATENT DOCUMENTS

| | | | | |
|---|---|---|---|---|
| 2,191,513 A | * | 2/1940 | Bigelow | |
| 2,517,394 A | * | 8/1950 | Tellier | |
| 3,094,207 A | * | 6/1963 | Millhiser et al. | |

(List continued on next page.)

FOREIGN PATENT DOCUMENTS

| | | |
|---|---|---|
| EP | 0 709 876 A1 | 5/1996 |
| EP | 0 840 381 A2 | 5/1998 |
| EP | 0 843 345 A2 | 5/1998 |
| EP | 0 926 719 A2 | 6/1999 |
| EP | 0 999 578 A2 | 5/2000 |
| EP | 1 026 729 A2 | 8/2000 |
| EP | 1 045 448 A1 | 10/2000 |
| JP | A 56-30650 | 3/1981 |
| JP | 60-5530 * 1/1985 | ................. 134/902 |
| JP | 63-16455 * 1/1988 | |
| JP | 4-293236 * 10/1992 | ................. 134/902 |
| JP | 5-21338 | 1/1993 |
| JP | 7-302889 | 11/1995 |
| JP | A 9-167724 6/1997 | ........... H01L/21/02 |
| KR | 1998-33377 | 7/1998 |
| WO | WO 99/06110 | 2/1999 |
| WO | WO 01/04933 | 1/2001 |
| WO | WO 01/10644 A1 | 2/2001 |

OTHER PUBLICATIONS

U.S. patent application Ser. No. 09/434,741, Yanagita, et al., filed Nov. 5, 1999.
U.S. patent application Ser. No. 09/399,643, Ohmi et al., filed Sep. 20, 1999.
U.S. patent appliction Ser. No. 09/435,285, Yanagita et al., filed Nov. 5, 1999.
U.S. patent application Ser. No. 09/434,740, Yanagita et al., filed Nov. 5, 1999.
U.S. patent application Ser. No. 10/153,608, Yanagita et al., filed May 24, 2002.
"A New Dielectric Isolation Method Using Porous Silicon", K. Imai, *Solid –State Electronics*, vol. 224, pp. 159–164, 1981.

(List continued on next page.)

*Primary Examiner*—Frankie L. Stinson
(74) *Attorney, Agent, or Firm*—Morgan & Finnegan, L.L.P.

(57) ABSTRACT

This invention is to provide a processing system suitable for manufacturing, e.g., an SOI substrate. A processing system includes a turntable on which holding mechanisms for holding bonded substrate stacks are mounted at a substantially equal angular interval, a driving mechanism for pivoting the turntable through a predetermined angle to move the bonded substrate stacks or separated substrates held by said holding mechanisms to operation positions and a centering apparatus, separating apparatus, and cleaning/drying apparatus for processing the bonded substrate stacks or separated substrates at the operation positions.

32 Claims, 12 Drawing Sheets

U.S. PATENT DOCUMENTS

| | | | |
|---|---|---|---|
| 3,489,608 A | * | 1/1970 | Jacobs et al. |
| 3,493,155 A | | 2/1970 | Litant et al. .................... 225/2 |
| 3,549,446 A | | 12/1970 | Bennett et al. ............. 156/230 |
| 3,667,661 A | | 6/1972 | Farmer .......................... 225/2 |
| 3,730,410 A | | 5/1973 | Altshuler ................... 225/96.5 |
| 3,970,471 A | * | 7/1976 | Bankes et al. |
| 4,047,973 A | * | 9/1977 | Williams |
| 4,208,760 A | * | 6/1980 | Dexter et al. |
| 4,215,928 A | * | 8/1980 | Bayley et al. |
| 4,850,381 A | * | 7/1989 | Moe et al. |
| 4,915,564 A | * | 4/1990 | Eror et al. |
| 4,962,879 A | | 10/1990 | Goesele et al. ............. 228/116 |
| 5,100,544 A | | 3/1992 | Izutani et al. ............... 210/175 |
| 5,248,886 A | * | 9/1993 | Asakawa et al. |
| 5,255,853 A | | 10/1993 | Munoz ................... 239/433 X |
| 5,357,645 A | * | 10/1994 | Onodera |
| 5,374,564 A | | 12/1994 | Bruel .......................... 437/24 |
| 5,379,235 A | | 1/1995 | Fisher et al. ................. 364/508 |
| 5,510,019 A | | 4/1996 | Yabumoto et al. .......... 210/137 |
| 5,653,247 A | * | 8/1997 | Murakami |
| 5,679,405 A | * | 10/1997 | Thomas et al. |
| 5,747,387 A | | 5/1998 | Koizumi et al. ............ 438/708 |
| 5,783,022 A | | 7/1998 | Cha et al. ................... 156/344 |
| 5,792,709 A | * | 8/1998 | Robinson et al. |
| 5,795,401 A | * | 8/1998 | Itoh et al. |
| 5,810,028 A | * | 9/1998 | Ichikawa et al. |
| 5,820,329 A | * | 10/1998 | Derbinski et al. |
| 5,849,602 A | | 12/1998 | Okamura et al. ............... 438/5 |
| 5,876,497 A | | 3/1999 | Atoji ........................... 117/85 |
| 5,928,389 A | | 7/1999 | Jevtic ........................ 29/25.01 |
| 5,934,856 A | | 8/1999 | Asakawa et al. ........... 414/217 |
| 5,954,888 A | * | 9/1999 | Gupta et al. |
| 5,994,207 A | | 11/1999 | Henley et al. ............... 438/515 |
| 6,007,675 A | * | 12/1999 | Toshima |
| 6,122,566 A | | 9/2000 | Nguyen et al. ............. 700/218 |
| 6,131,589 A | * | 10/2000 | Vogtmann et al. |
| 6,168,499 B1 | * | 1/2001 | Jang |
| 6,221,740 B1 | | 4/2001 | Bryan et al. ................ 438/458 |
| 6,277,234 B1 | | 8/2001 | Freund et al. .............. 156/344 |
| 6,321,134 B1 | | 11/2001 | Henley et al. ............... 700/121 |
| 6,382,292 B1 | | 5/2002 | Ohmi et al. |
| 6,418,999 B1 | | 7/2002 | Yanagita et al. |
| 6,527,031 B1 | | 3/2003 | Yanagita et al. |

OTHER PUBLICATIONS

"Silicon on Insulator Material by Wafer Bonding", Christine Harendt, Charles E. Hunt e al., *Journal of Electronic Materials,* vol. 20, pp. 267–277, 1991.

Michel Bruel, et al. "Smart–Cut: A New Silicon On Insulator Material Technology Based On Hydrogen Implantation And Wafer Bonding", *Jpn. J. Appl. Phys.* vol. 36, No. 3B, Part 01, Mar. 1, 1997, pp. 1636–1641.

"Water Jet", vol. 1, No. 1, p. 4 (1984).

"Light Scattering Topography Characterization of Bonded SOI Wafer", H. Baumgart, et al., *Extended Abstracts,* vol. 91–2, pp. 733–734, 1991.

"Thinning of Bonded Wafer: Etch–Stop Approaches", Charges E. Hunt et al., *Extended Abstracts,* vol. 91–2, pp. 696–697, 1991.

"Epitaxial Layer Transfer by Bond and Etch Back of Porous Si", Takao Yonehara et al., *Applied Physics Letters,* vol. 64, pp. 2108–2110, 1994.

"Electrolytic Shaping of Germanium and Silicon", A. Uhlir et al., *Bell System Technical Journal,* vol. 35, pp. 333–347, 1956.

"Oxidized Porous Silicon and It's Application", K. Nagano et al., *The Transactions of the Institute of Electronics and Communication Engineets, The Institute of Electronics, Information and Communication engineers,* vol. 79, pp. 49–54, SSD 79–9549, 1979.

"Single–Crystal Silicon on Non–Single–Crystal Insulators", G.W. Cullen, *Journal of Crystal Growth,* vol. 63, No. 3, pp. 429–590, 1983.

"Crystalline Quality of Silicon Layer Formed by FIPOS Technology", Kazuo IMAI et al., *Journal of Crystal Growth,* vol. 63, pp 547–553, 1987.

"Silicon–On–Insulator by Wafer Bonding: A Review", W.P. Maszara, *Journal of Electrochemical Society,* vol. 138, pp. 314–347, 1991.

* cited by examiner

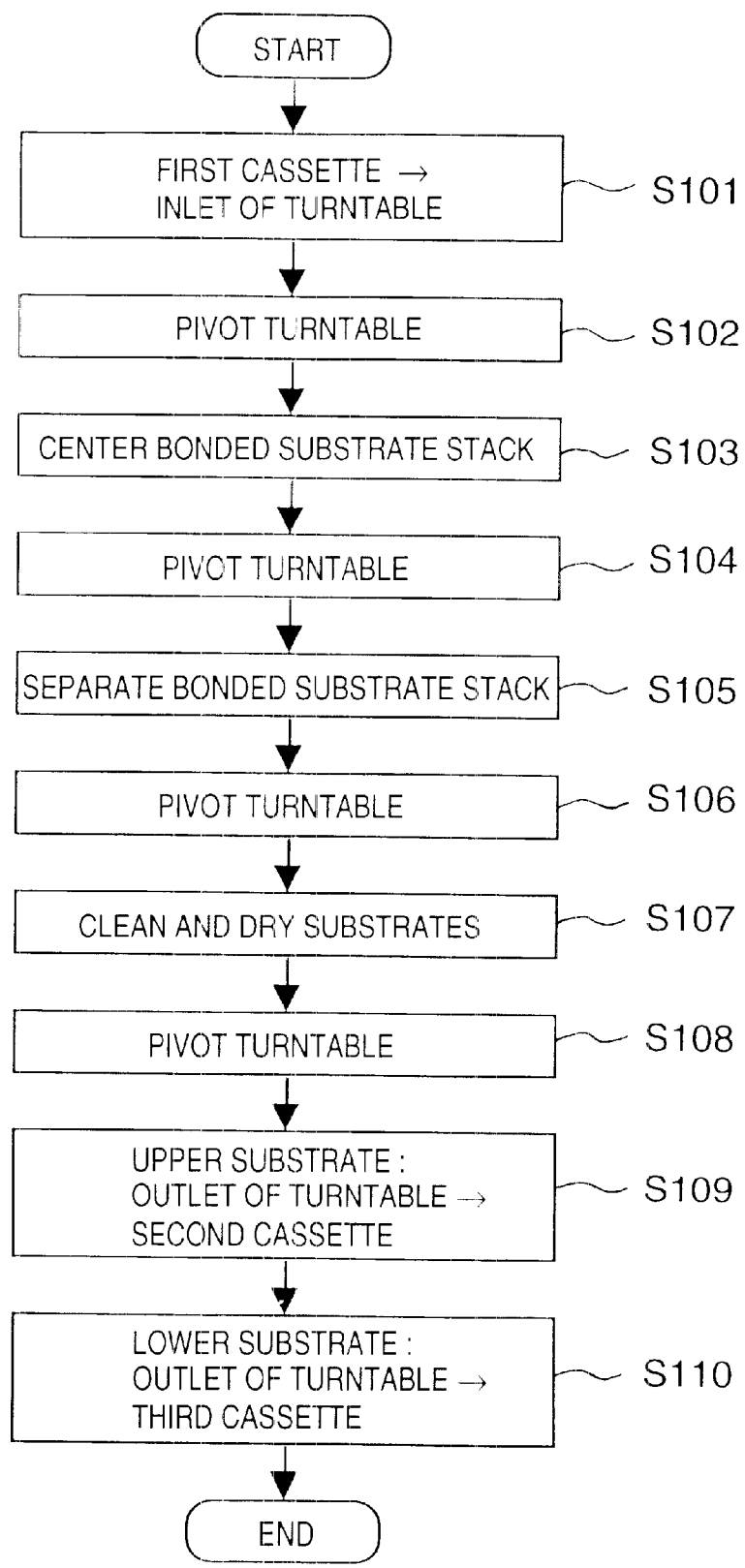

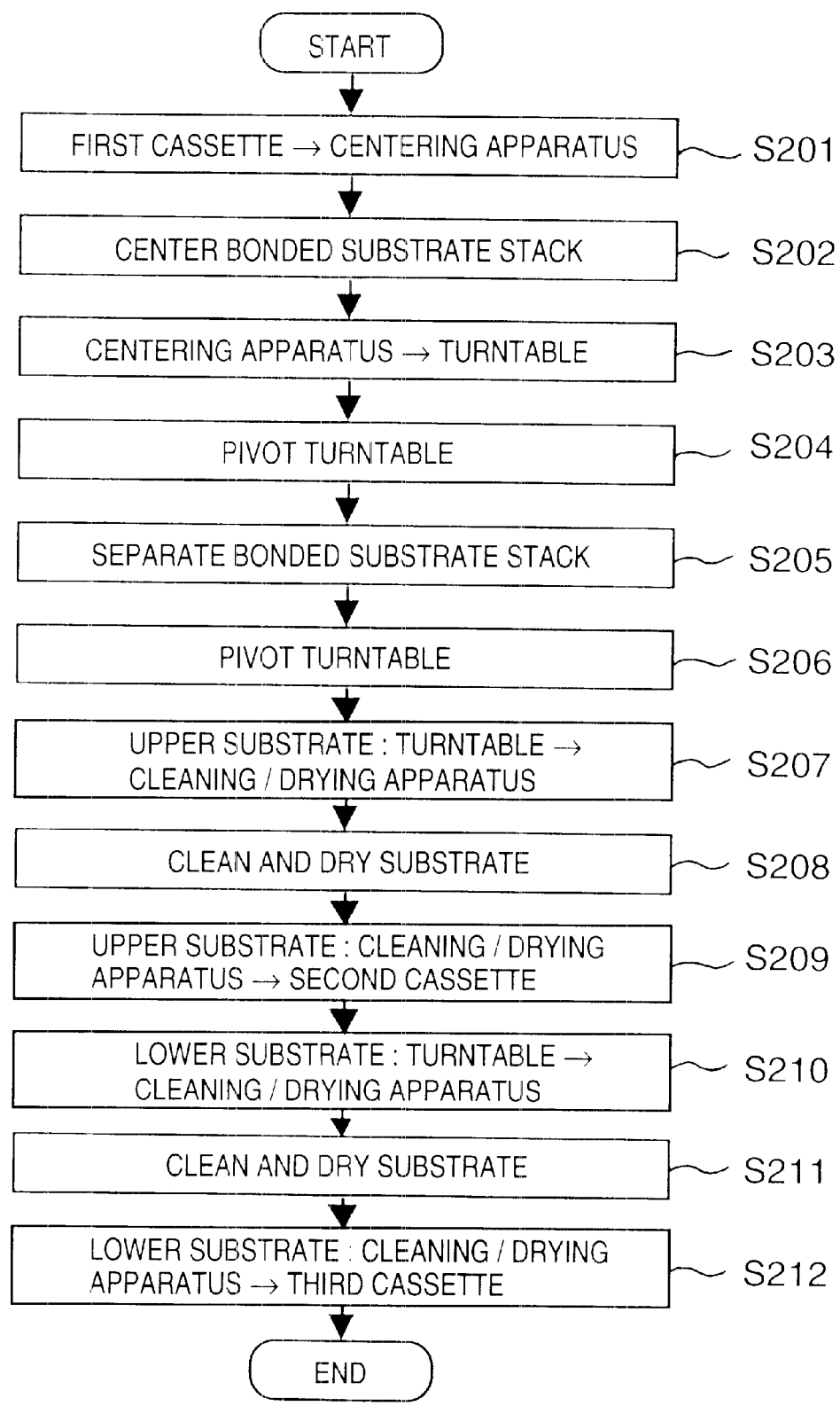

SAMPLE PROCESSING SYSTEM

BACKGROUND OF THE INVENTION

1. Field of the Invention

The present invention relates to a sample processing system suitable for manufacturing, e.g., a semiconductor substrate.

2. Description of the Related Art

A substrate (SOI substrate) having an SOI (Silicon On Insulator) structure is known as a substrate having a single-crystal Si layer on an insulating layer. A device using this SOI substrate has many advantages that cannot be achieved by ordinary Si substrates. Examples of the advantages are as follows.

(1) The integration degree can be increased because dielectric isolation is easy.

(2) The radiation resistance can be increased.

(3) The operating speed of the device can be increased because the stray capacitance is small.

(4) No well step is necessary.

(5) Latch-up can be prevented.

(6) A completely depleted field effect transistor can be formed by thin film formation.

Since an SOI structure has the above various advantages, researches have been made on its formation method for several decades.

As one SOI technology, the SOS (Silicon On Sapphire) technology by which Si is heteroepitaxially grown on a single-crystal sapphire substrate by CVD (Chemical Vapor Deposition) has been known for a long time. This SOS technology once earned a reputation as the most matured SOI technology. However, the SOS technology has not been put into practical use to date because, e.g., a large amount of crystal defects are produced by lattice mismatch in the interface between the Si layer and the underlying sapphire substrate, aluminum that forms the, sapphire substrate mixes in the Si layer, the substrate is expensive, and it is difficult to obtain a large area.

Various SOI technologies have appeared next to the SOS technology. For these SOI technologies, various methods have been examined to reduce crystal defects or manufacturing cost. The methods include a method of ion-implanting oxygen into a substrate to form a buried oxide layer, a method of bonding two wafers via an oxide film and polishing or etching one wafer to leave a thin single-crystal Si layer on the oxide film, and a method of ion-implanting hydrogen to a predetermined depth from the surface of an Si substrate having an oxide film, bonding the!substrate to another substrate, leaving a thin single-crystal Si layer on the oxide film by heating or the like, and peeling one (the other substrate) of the bonded substrates.

The present applicant has disclosed a new SOI technology in Japanese Patent Laid-Open No. 5-21338. In this technology, a first substrate prepared by forming an unporous single-crystal layer (including a single-crystal Si layer) on a single-crystal semiconductor substrate having a porous layer is bonded to a second substrate via an insulating layer. After this, the substrates are separated at the porous layer, thereby transferring the unporous single-crystal layer to the second substrate. This technique is advantageous because the film thickness uniformity of the SOI layer is good, the crystal defect density in the SOI layer can be decreased, the surface planarity of the SOI layer is good, no expensive manufacturing apparatus with special specifications is required, and SOI substrates having about several hundred Å to 10-$\mu$m thick SOI films can be manufactured by a single manufacturing apparatus.

The present applicant has also disclosed a technique in Japanese Patent Laid-Open No. 7-302889, in which first and second substrates are bonded, the first substrate is separated from the second substrate without being broken, the surface of the separated first substrate is planarized, a porous layer is formed again, and the porous layer is reused. Since the first substrate is not wasted, this technique is advantageous in greatly reducing the manufacturing cost and simplifying the manufacturing process.

According to the SOI substrate manufacturing methods proposed by the present applicant, a high-quality SOI substrate can be manufactured. However, to mass-produce SOI substrates, for example, the series of processing operations must be performed at a high speed.

SUMMARY OF THE INVENTION

The present invention has been made in consideration of the above situation, and has as its object to provide a processing system suitable for manufacturing, e.g., an SOI substrate.

According to the present invention, there is provided a sample processing system characterized by comprising a turntable on which holding mechanisms for holding samples are mounted at a substantially equal angular interval, a driving mechanism for pivoting the turntable through a predetermined angle to move the samples held by the holding mechanisms to operation positions, and at least one processing apparatus for processing the sample held by the holding mechanism at a predetermined operation position.

In the processing system, the operation positions preferably include, e.g., an inlet position at which the sample for which processing is to: be started is received, and an outlet position at which the processed sample is transferred.

The processing system preferably further comprises, e.g., a conveyor mechanism for transferring the sample to be processed to the holding mechanism located at the operation position as the inlet position and receiving the processed sample from the holding mechanism located at the operation position as the outlet position.

In the processing system, for example, the conveyor mechanism preferably transfers a, plate-like sample in a horizontal state to the holding mechanism located at the inlet position and receives the processed plate-like sample in the horizontal state from the holding mechanism located at the outlet position.

In the processing system, the conveyor mechanism preferably comprises, e.g., a scalar robot.

In the processing system, the holding mechanism preferably has, e.g., a lower holding mechanism for holding the plate-like sample from a lower side.

In the processing system, the holding mechanism preferably has, e.g., a lower holding mechanism for holding the plate-like sample from a lower side, and an upper holding mechanism for holding the plate-like sample from an upper side.

In the processing system, preferably, for example, the sample to be processed has a separation layer, and the at least one processing apparatus comprises a separating apparatus for separating the sample at the separation layer.

In the processing system, for example, the separating apparatus preferably ejects a stream of a fluid toward the separation layer of the sample held by the holding mechanism located at the operation position at which the sample is separated, thereby separating the sample at the separation layer.

In the processing system, preferably, for example, the holding mechanism has a driving source for rotating the sample about an axis perpendicular to the separation layer, and the separating apparatus separates the sample rotated by the driving source.

In the processing system, at least one processing apparatus preferably comprises, e.g., a centering apparatus for centering the sample.

In the processing system, for example, the centering apparatus preferably centers the sample held by the holding mechanism located at the operation position for centering processing.

In the processing system, at least one processing apparatus preferably comprises, e.g., a cleaning apparatus for cleaning a sample separated by the separating apparatus.

In the processing system, the cleaning apparatus preferably cleans the sample held by the holding mechanism located at the operation position for cleaning processing.

In the processing system, at least one processing apparatus preferably comprises, e.g., a cleaning/drying apparatus for cleaning and drying a sample separated by the separating apparatus.

In the processing system, for example, the cleaning/drying apparatus preferably cleans and dries the sample held by the holding mechanism located at the operation position for cleaning/drying processing.

In the processing system, processing operations are preferably parallelly executed at the operation positions.

The processing system preferably further comprises, e.g., a centering apparatus for centering the sample, and a conveyor mechanism for receiving the sample centered by the centering apparatus and transferring the sample to the holding mechanism located at the inlet position.

The processing system preferably further comprises, e.g., a cleaning apparatus for cleaning the sample, and a conveyor mechanism for receiving the sample held by the holding mechanism located at the outlet position and transferring the sample to the cleaning apparatus.

The processing system preferably further comprises, e.g., a cleaning/drying apparatus: for cleaning and drying the sample, and a conveyor mechanism for receiving the sample held by the holding mechanism located at the outlet position and transferring the sample to the cleaning/drying apparatus.

The processing system preferably further comprises, e.g., a centering apparatus for centering the sample, a first conveyor mechanism for receiving the sample centered by the centering apparatus and transferring the sample to the holding mechanism located at the inlet position, a cleaning apparatus for cleaning the sample, and a second conveyor mechanism for receiving the sample held by the holding mechanism located at the outlet position and transferring the sample to the cleaning apparatus.

The processing system preferably further comprises, e.g., a centering apparatus for centering the sample, a first conveyor mechanism for receiving the sample centered by the centering apparatus and transferring the sample to the holding mechanism located at the inlet position, a cleaning/drying apparatus for cleaning and drying the sample, and a second conveyor mechanism for receiving the sample held by the holding mechanism located at the outlet position and transferring the sample to the cleaning/drying apparatus.

The processing system preferably further comprises, e.g., a third conveyor mechanism for transferring the sample to the centering apparatus and receiving the sample from the cleaning apparatus.

The processing system preferably further comprises, e.g., a third conveyor mechanism for transferring the sample to the centering apparatus and receiving the sample from the cleaning/drying apparatus.

The processing system preferably further comprises, e.g., an apparatus for processing the sample before the sample is transferred to the holding mechanism located at the inlet position.

The processing system preferably further comprises, e.g., an apparatus for processing the sample after the sample is received from the holding mechanism located at the outlet position.

In the processing system, the separation layer is preferably, e.g., a layer having a fragile structure.

In the processing system, the layer having the fragile structure is preferably, e.g., a porous layer.

In the processing system, the layer having the fragile structure is preferably, e.g., a microcavity layer.

In the processing system, the sample to be processed is preferably, e.g., a semiconductor substrate.

In the processing system, preferably, the sample to be processed is formed by, e.g., bonding a first substrate and a second substrate and has a layer having a fragile structure as the separation layer.

In the processing system, the sample to be processed is preferably formed by, e.g., forming a porous layer on a surface of a first semiconductor substrate, forming an unporous layer on the porous layer, and bonding a second substrate to the unporous layer.

Further objects, features and advantages of the present invention will become apparent from the following detailed description of the embodiments of the present invention with reference to the accompanying drawings.

BRIEF DESCRIPTION OF THE DRAWINGS

FIG. 10 is a flow chart showing the flow of processing for one bonded substrate stack in the processing system according to the first embodiment;

FIG. 11 is a flow chart showing the flow of processing for one bonded substrate stack in the processing system according to the second embodiment.

DETAILED DESCRIPTION OF THE PREFERRED EMBODIMENTS

Preferred embodiments of the present invention will be described below with reference to the accompanying drawings.

FIGS. 1A to 1E are sectional views for explaining steps in manufacturing an SOI substrate according a preferred embodiment of the present invention.

Figure 1A:
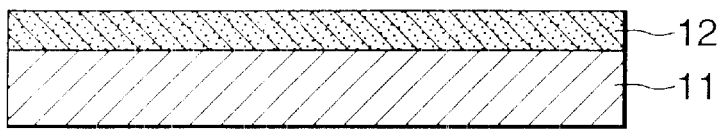
FIGS. 1A to 1E are sectional views for explaining the steps in manufacturing an SOI substrate according to a preferred embodiment of the present invention.
Figure 1B:
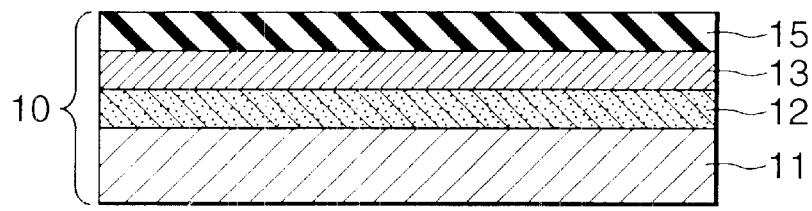

In the step shown in FIG. 1A, a single-crystal Si substrate 11 is prepared, and a porous Si layer 12 is formed on the surface of the single-crystal Si substrate 11 by, e.g., anodizing. In the step shown in FIG. 1B, an unporous single-crystal Si layer 13 is formed on the porous Si layer 12 by epitaxial growth. An insulating layer (e.g., an $SiO_2$ layer) 15 is formed on the unporous single-crystal Si layer 13. With this process, a first substrate 10 is formed.

Figure 1C:
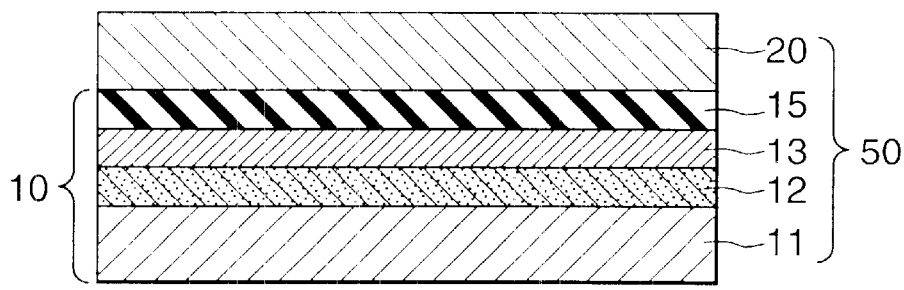

In the step shown in FIG. 1C, a second substrate 20 is prepared and brought into tight contact with the first substrate 10 at room temperature while making the insulating layer 15 oppose the second substrate 20. After this, the first substrate 10 and second substrate 20 are bonded by anodic bonding, pressing, heating, or a combination thereof. The insulating layer 15 and second substrate 20 are firmly bonded to form a bonded substrate stack 50. The insulating layer 15 maybe formed on the unporous single-crystal Si layer 13, as described above. Alternatively, the insulating layer 15 may be formed either on the second substrate 20 or on both the unporous single-crystal Si layer 13 and second substrate 20 as far as the state shown in FIG. 1C is obtained upon bringing the first and second substrates into tight contact with each other.

Figure 1D:
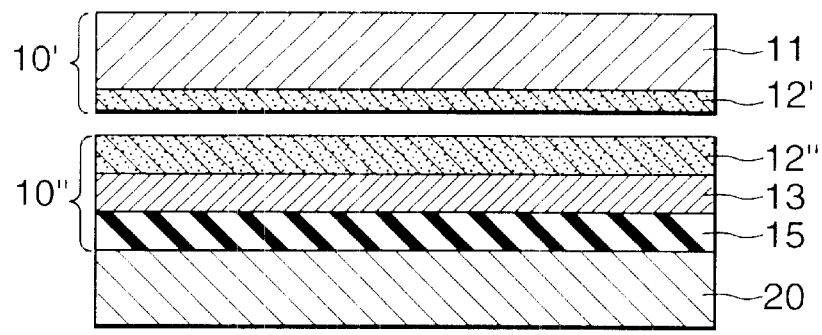

In the step shown in FIG. 1D, the two bonded substrates are separated at the porous Si layer 12. The second substrate side (10"+20) has a multilayered structure of porous Si layer 12"/single-crystal Si layer 13/insulating layer 15/single-crystal Si substrate 20. The first substrate side (10') has a structure wherein a porous Si layer 12' is formed on the single-crystal Si substrate 11.

After the remaining porous Si layer 12' is removed, and the surface of the porous Si layer 12' is planarized as needed, the separated substrate (10') is used as a single-crystal Si substrate 11 for forming a first substrate (10) again.

Figure 1E:
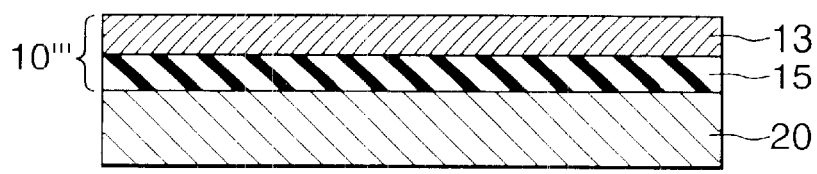

After the bonded substrate stack is separated, in the step shown in FIG. 1E, the porous layer 12" on the surface on the second substrate side (10'+20) is selectively removed. With this process, a substrate having a multilayered structure of a single-crystal Si layer 13/insulating layer 15/single-crystal Si substrate 20, i.e., an SOI structure is obtained.

As the second substrate, for example, not only a single-crystal Si substrate but also an insulating substrate (e.g., quartz substrate) or a transparent substrate (e.g., quartz substrate) can be used.

In the above manufacturing process, to facilitate the process of bonding two substrates and separating them (FIG. 1D), a porous Si layer 12 having a fragile structure is formed in the separation region. In place of the porous layer, for example, a microcavity layer may be formed. The microcavity layer can be formed by, e.g., implanting ions into a semiconductor substrate.

A processing system suitable for bonded substrate stack separation processing (FIG. 1D) in the above process of manufacturing, e.g., an SOI substrate will be described below. The following separating system can be applied to separate not only a bonded substrate stack but also another sample.

First Embodiment

Figure 2:
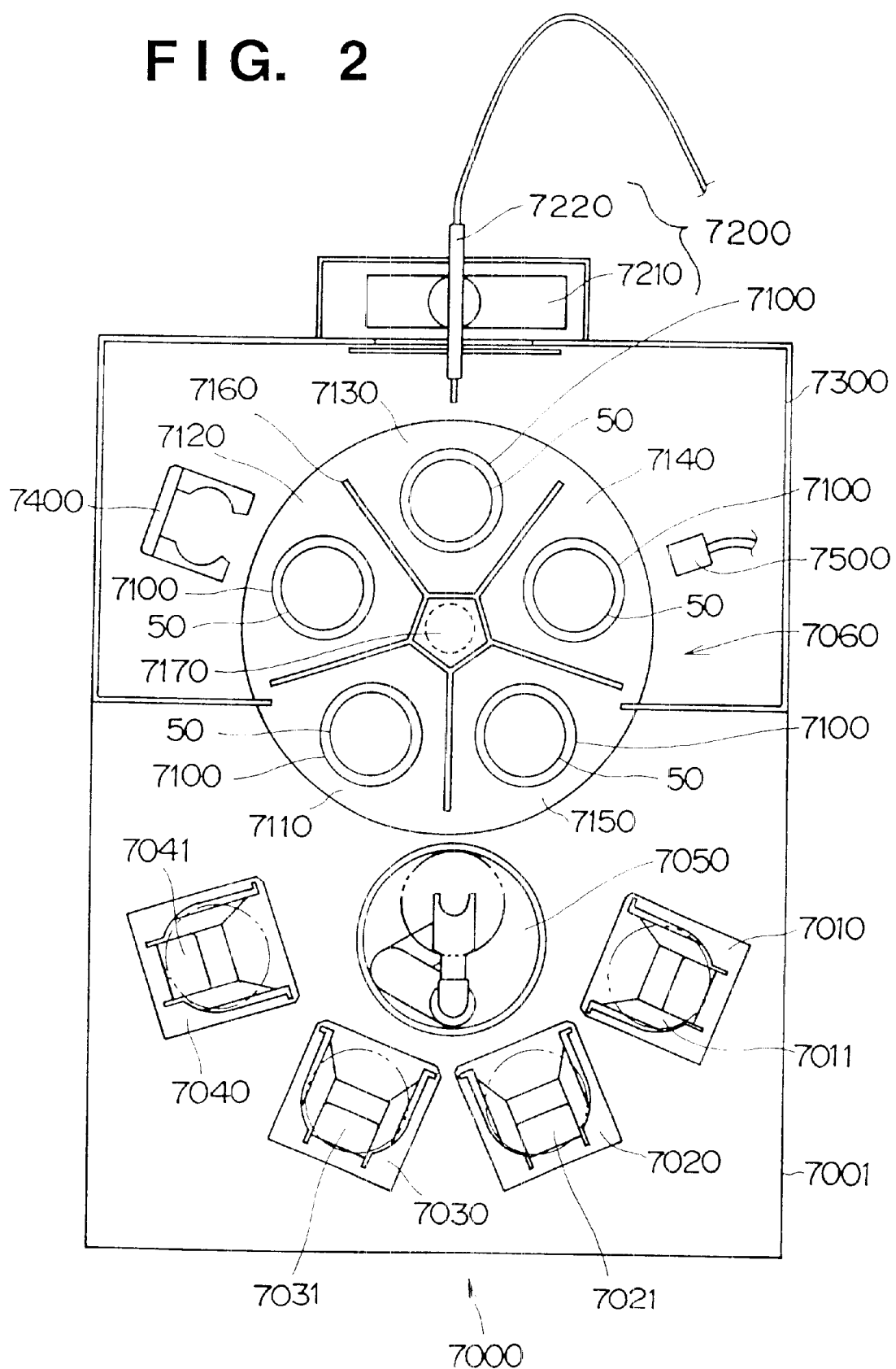
FIG. 2 is a plan view showing the schematic arrangement of a processing system according to the first embodiment of the present invention.

FIG. 2 is a plan view showing the schematic arrangement of a processing system according to the first embodiment of the present invention. A processing system 7000 extracts a bonded substrate stack from a cassette, separates the bonded substrate stack, cleans and dries the separated substrates, classifies the processed substrates, and stores them in cassettes.

The processing system 7000 has a turntable 7060 on which a plurality of holding mechanisms 7100 for holding bonded substrate stacks or separated substrates are mounted at a substantially equal angular interval. The turntable 7060 has partition plates 7160 for partitioning the holding mechanisms 7100.

Figure 3:
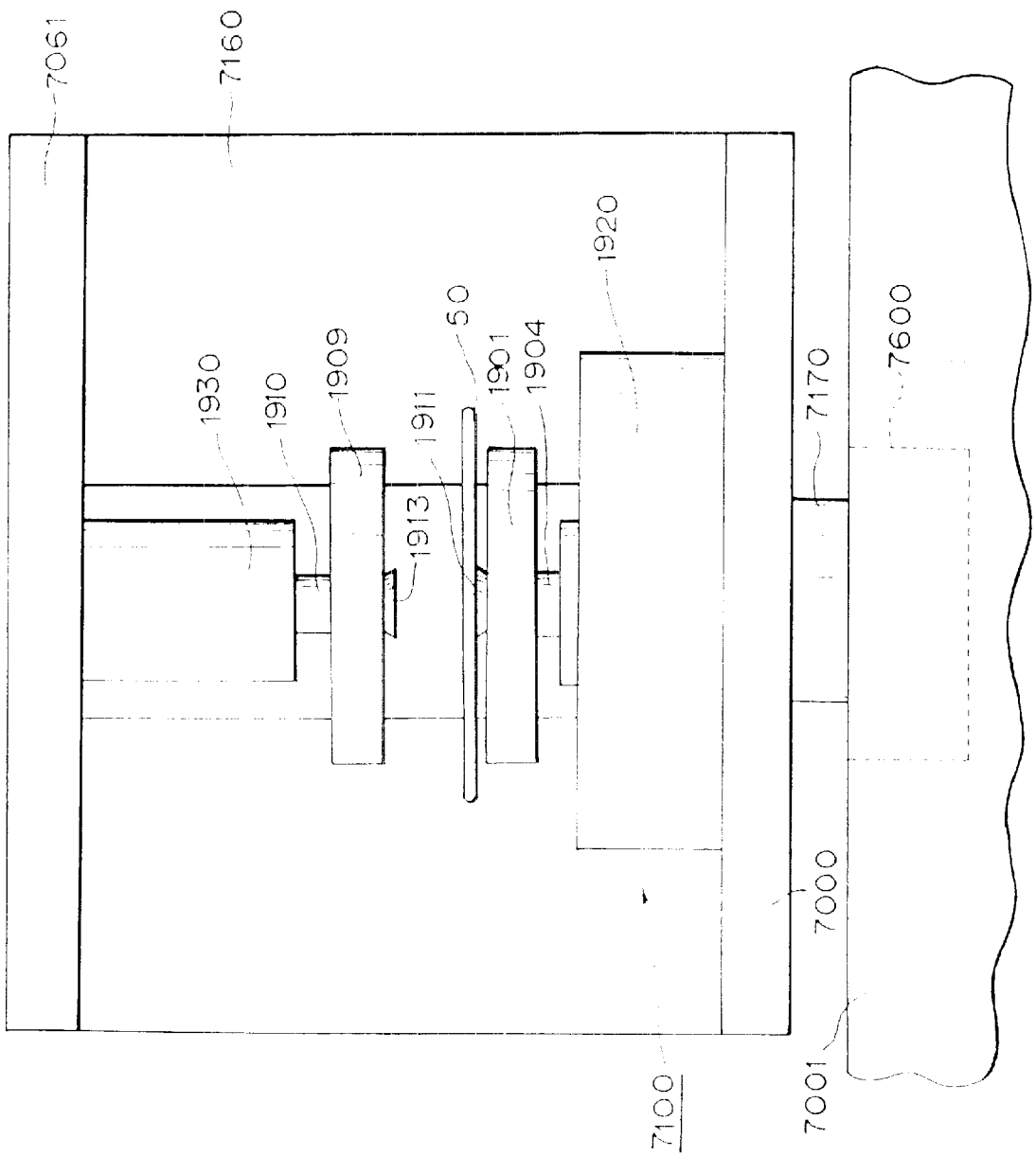
FIG. 3 is a view schematically showing a state wherein a bonded substrate stack is transferred to a holding mechanism located at the inlet position.

As shown in FIG. 3, the turntable 7060 is coupled to a rotating shaft 7170 of a motor 7600 fixed in a support table 7001. The motor 7600 pivots the turntable 7060 through a predetermined angle to move the bonded substrate stacks 50 or separated substrates held by the holding mechanisms 7100 to operation positions 7110 to 7150, respectively.

The operation position 7110 is an inlet position where the holding mechanism 7100 receives a bonded substrate stack 50 to be processed from a scalar robot 7050. At the operation position 7120, the bonded substrate stack 50 is centered by a centering apparatus 7400. At the operation position 7130, the bonded substrate stack 50 is separated at the porous layer by a separating apparatus 7200. At the operation position 7140, separated substrates are cleaned and dried by a cleaning/drying apparatus 7500. The operation position 7150 is an outlet position where each processed substrate is transferred to the scalar robot 7050.

The turntable 7060 is accommodated in a chamber 7300 except the portion of the inlet position 7110 and outlet position 7150.

The processing system 7000 has a loader 7040, first unloader 7030, second unloader 7020, and third unloader 7010. Before processing, a first cassette 7041 storing one or a plurality of bonded substrate stacks is placed on the loader 7040. Before processing, an empty second cassette 7031 is placed on the first unloader 7030, an empty third cassette 7021 is placed on the second unloader 7020, and an empty fourth cassette 7011 is placed on the third unloader 7010.

The scalar robot 7050 rotates the robot hand about a predetermined rotating shaft and moves the robot hand close to or away from the rotating shaft to convey the bonded substrate stack or separated substrate.

The separating apparatus 7200 ejects a jet from a nozzle 7220 toward the porous layer of the bonded substrate stack 50 held by the holding mechanisms 7100, thereby separating the bonded substrate stack 50 into two substrates at the porous layer. That is, this separating apparatus 7200 uses the water jet method.

Generally, the water jet method ejects a high-speed, high-pressure stream of water to an object to, e.g., cut or process a ceramic, metal, concrete, resin, rubber, or wood, remove a coating film from the surface, or clean the surface ("Water Jet", Vol. 1, No. 1, page 4 (1984)).

This separating apparatus ejects a stream of fluid to the porous layer (separation region) as a fragile structure of a bonded substrate stack to selectively break the porous layer, thereby separating the substrate stack at the porous layer. The stream will be referred to as a "jet" hereinafter. As the fluid forming a jet, it is possible to use water, an organic solvent such as alcohol, an acid such as hydrofluoric acid or nitric acid, an alkali such as potassium hydroxide, a gas such as air, nitrogen gas, carbonic acid gas, a rare gas, or an etching gas, or a plasma.

When this separating apparatus is applied to manufacture a semiconductor device or separate, e.g., a bonded substrate stack, pure water with minimum impurity metals or particles is preferably used as the fluid forming a jet.

The jet ejecting conditions can be determined in accordance with, e.g., the type of separation region (e.g., a porous layer) or the shape of the side surfaces of the bonded substrate stack. As the jet ejecting conditions, for example, pressure to be applied to the jet medium, jet scanning speed, nozzle width or diameter (the diameter is substantially the same as the jet diameter), nozzle shape, distance between the nozzle and the separation region, and flow rate of the jet are used as important parameters.

According to the separating method using the water jet method, a bonded substrate stack can be separated into two substrates without damaging the bonded substrate stack.

This separating apparatus holds a sample such as a bonded substrate stack while setting the sample surface substantially horizontally, and in this state, separates the sample at the fragile structure (e.g., a porous layer). When the sample is held with its surface set horizontally, for example, (1) the sample can be prevented from dropping, (2) the sample can be easily held, (3) the sample can be easily conveyed, (4) the sample can be efficiently transferred between the separating apparatus and another apparatus, and (5) the projection area (occupation area) of the separating apparatus can be reduced because the constituent elements can be disposed in the vertical direction.

Figure 8:
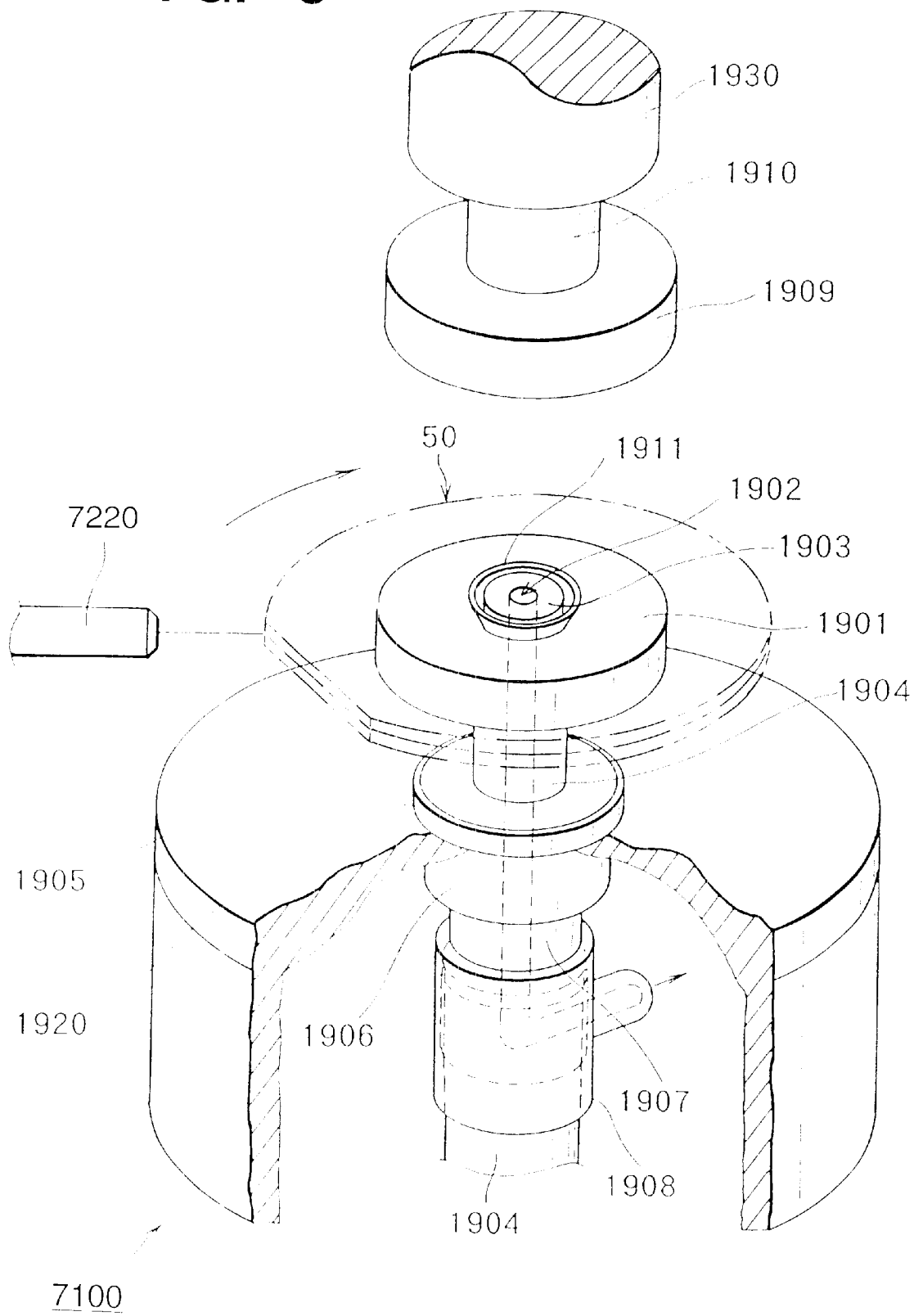
FIG. 8 is a view showing the schematic arrangement of the holding mechanism mounted on a turntable.
Figure 9:
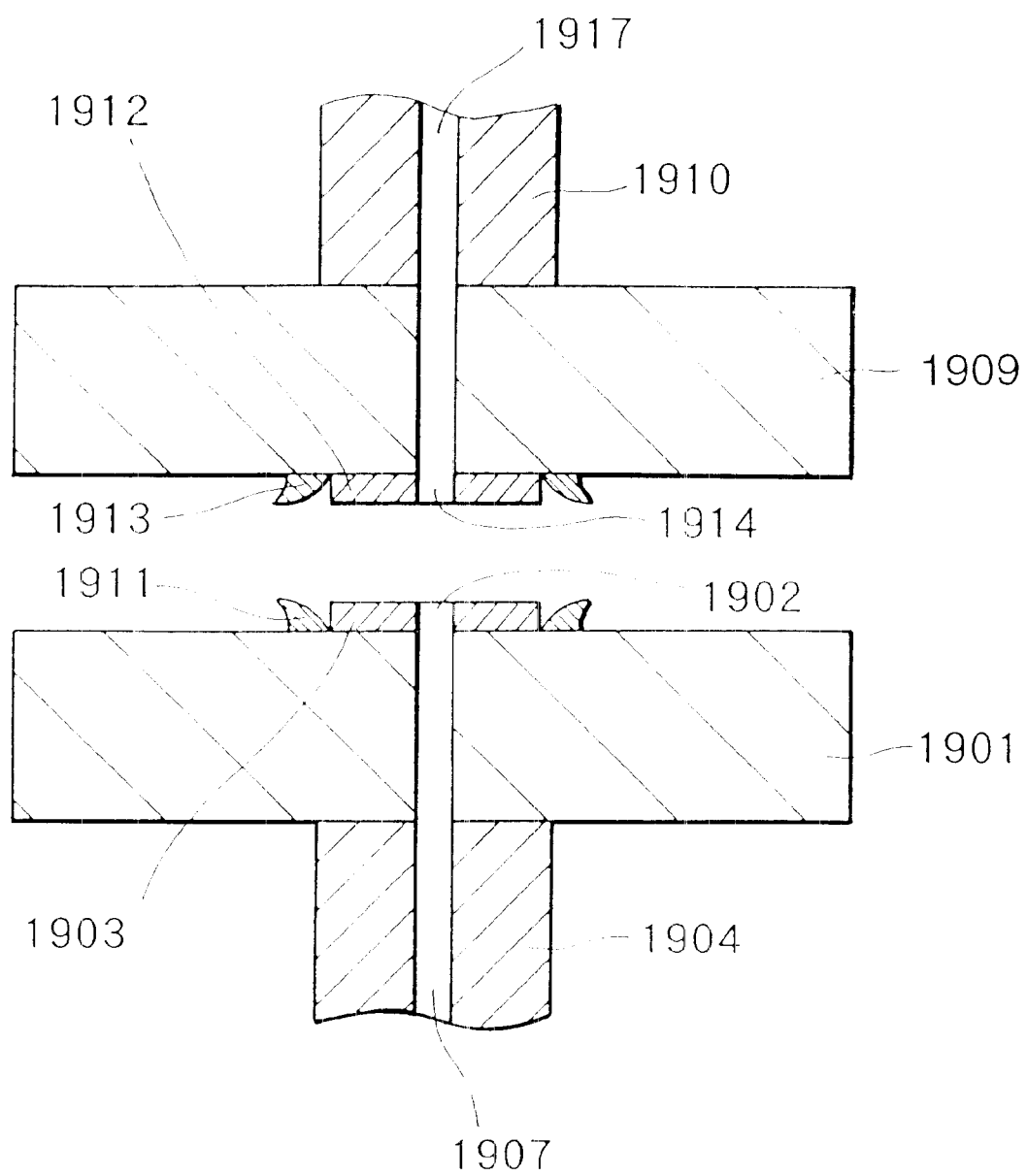
FIG. 9 is a view showing part of the holding mechanism shown in FIG. 8.

FIG. 8 is a view showing the schematic arrangement of the holding mechanism 7100 mounted on the turntable 7060. FIG. 9 is a view showing part of the holding mechanism 7100 shown in FIG. 8.

The holding mechanism 7100 has a pair of substrate holding portions 1909 and 1901. The substrate holding portions 1909 and 1901 horizontally hold the bonded substrate stack 50 by sandwiching it from the lupper and lower sides.

The lower substrate holding portion 1901 has a convex support portion 1903 which forms a gap between the bonded substrate stack 50 and the surface of the substrate holding portion 1901 such that the robot hand of the scalar robot 7050 can be inserted into the gap. The support portion 1903 has a suction hole 1902 for vacuum-chucking the bonded substrate stack 50. The substrate holding portion 1901 has a shift prevention member 1911 around the support portion 1903. The shift prevention member 1911 formed from, e.g., rubber or a resin prevents the bonded substrate stack 50 from moving in the planar direction. With this shift prevention member 1911, the bonded substrate stack 50 can be held by a small press or suction force.

The substrate holding portion 1901 is coupled to one end of a rotating shaft 1904. The rotating shaft 1904 is supported by a support table 1920 via a bearing 1906. The bearing 1906 has, at its upper portion, a sealing member 1905 for sealing the opening portion formed in the support table 1920 to pass the rotating shaft 1904. A vacuum line 1907 extends through the rotating shaft 1904. The vacuum line 1907 is connected to the suction hole 1902 of the substrate holding portion 1901. The vacuum line 1907 is also connected to an external vacuum line via a ring 1908. The rotating shaft 1904 is coupled to a rotation source (not shown) to be rotated by a rotation force applied from the rotation source.

The substrate holding portion 1909 is disposed above the substrate holding portion 1901. The substrate holding portion 1909 is coupled to a driving shaft 1910 of a driving mechanism 1930 to be vertically moved by the driving mechanism 1930. The driving shaft 1910 is rotatably axially supported by the driving mechanism 1930.

The upper substrate holding portion 1909 has a convex support portion 1912 which forms a gap between the bonded substrate stack 50 and the surface of the substrate holding portion 1909 such that the robot hand of the scalar robot 7050 can be inserted into the gap. The support portion 1912 has a suction hole 1914 for vacuum-chucking the bonded substrate stack 50. The substrate holding portion 1909 has a shift prevention member 1913 around the support portion 1912. The shift prevention member 1913 formed from, e.g., rubber or a resin prevents the bonded substrate stack 50 from moving in the planar direction. With this shift prevention member 1913, the bonded substrate stack 50 can be held by a small press or suction force.

For example, when the holding mechanism 7100 is located at the separation processing position 7130, the nozzle 7220 of the separating apparatus 7200 opposes the holding mechanism, as shown in FIG. 8. The nozzle 7220 is controlled by an orthogonal robot 7210. A shutter for cutting the jet ejected from the nozzle 7220 as needed maybe inserted between the nozzle 7220 and substrate holding portion 1901.

The procedures of separation processing by the separating apparatus 7200 will be described below. As the turntable 7060 pivots, the holding mechanism 7100 holding the bonded substrate stack 50 centered at the centering processing position 7120 moves to the separation processing position 7130.

At the separation processing position 7130, the driving mechanism 1930 moves the substrate holding portion 1909 downward, and the substrate holding portion 1909 presses the bonded substrate stack 50. The bonded substrate stack 50 is pressed and held by the substrate holding portions 1909 and 1901 from both sides.

The rotation source (not shown) is rotated to transmit the rotational force to the rotating shaft 1904. The rotating shaft 1904, substrate holding portion 1901, bonded substrate stack 50, and substrate holding portion 1909 rotate integrally.

A high-pressure jet medium (e.g., water) is supplied from a pump (not shown) to the nozzle 7220. The high-pressure jet is ejected from the nozzle 7220 toward the porous layer of the bonded substrate stack 50 to start separating the bonded substrate stack 50.

When the bonded substrate stack 50 is completely separated, the operation of the pump coupled to the nozzle 7220 is stopped to stop ejecting the jet to the bonded substrate stack 50. Driving of the rotating shaft 1904 is also stopped to stop rotating the bonded substrate stack 50.

The vacuum chuck mechanisms of the substrate holding portions 1901 and 1909 are actuated. The upper separated substrate is chucked by the substrate holding portion 1909 while the lower separated substrate is chucked by the substrate holding portion 1909. The driving mechanism 1930 moves the substrate holding portion 1909 upward. The two substrates are spaced apart from each other.

After the bonded substrate stack 50 is separated into two substrates, the fluid is present between the two substrates. When this fluid is a liquid (e.g., water), the surface tension is considerably large. Hence, to separate the two substrate with a small force, the jet is preferably supplied from the nozzle 7220 to the gap between the two substrates. In this case, the jet from the nozzle 7220 is stopped after the two substrates are separated. Instead, a mechanism for ejecting a jet used to separate the two substrates may be independently prepared.

The processing system 7000 shown in FIG. 2 has an arrangement integrating the turntable 7060, centering apparatus 7400, separating apparatus 7200, cleaning/drying apparatus 7500, scalar robot 7056, loader 7040, first unloader 7030, second unloader 7020, and third unloader 7010 on the support table 7001. In another embodiment, however, these constituent elements may be put into units, and the units may be connected in use to build a processing system. For example, the turntable 7060, centering apparatus 7400, separating apparatus 7200, and cleaning/drying apparatus 7500 are integrated into the first unit. The scalar robot 7050 is used as the second unit. The loader 7040, first unloader 7030, second unloader 7020, and third unloader 7010 are integrated into the third unit. The first to third units are integrated in use to construct one processing system.

FIG. 10 is a flow chart showing the flow of processing for one bonded substrate stack in the processing system 7000. First, the first cassette 7041 storing bonded substrate stacks to be processed is placed at a predetermined position on the loader 7040 manually or automatically. The empty second cassette 7031, third cassette 7021, and fourth cassette 7011 are placed on the first unloader 7030, second unloader 7020, and third unloader 7010, respectively.

In this embodiment, the second cassette 7031 is used to store upper separated substrates, the third cassette 7021 is used to store lower separated substrates, and the fourth cassette 7011 is used to store bonded substrate stacks (or separated substrates) for which separation has failed.

The first cassette 7041 is placed on the loader 7040 such that the stored bonded substrate stacks become horizontal. The second cassette 7031, third cassette 7021, and fourth cassette 7011 are placed on the first unloader 7030, second unloader 7020, and third unloader 7010, respectively, such that the substrates can be stored horizontally.

In step S101, the scalar robot 7050 extracts a bonded substrate stack from the first cassette 7041 on the loader 7040 and transfers the bonded substrate stack to the holding mechanism 7100 located at the inlet position 7110. FIG. 3 is a view schematically showing a state wherein a bonded substrate stack is transferred to the holding mechanism 7100 located at the inlet position 7110. More specifically, in step S101, the scalar robot 7050 supports the bonded substrate stack 50 from the lower side and places it on the lower substrate holding portion 1901 of the holding mechanism 7100.

In step S102, the turntable 7060 is pivoted through a predetermined angle (72° in this example) clockwise when viewed from the upper side to move the bonded substrate stack transferred to the holding mechanism 7100 in step S101 to the centering processing position 7120.

Figure 4:
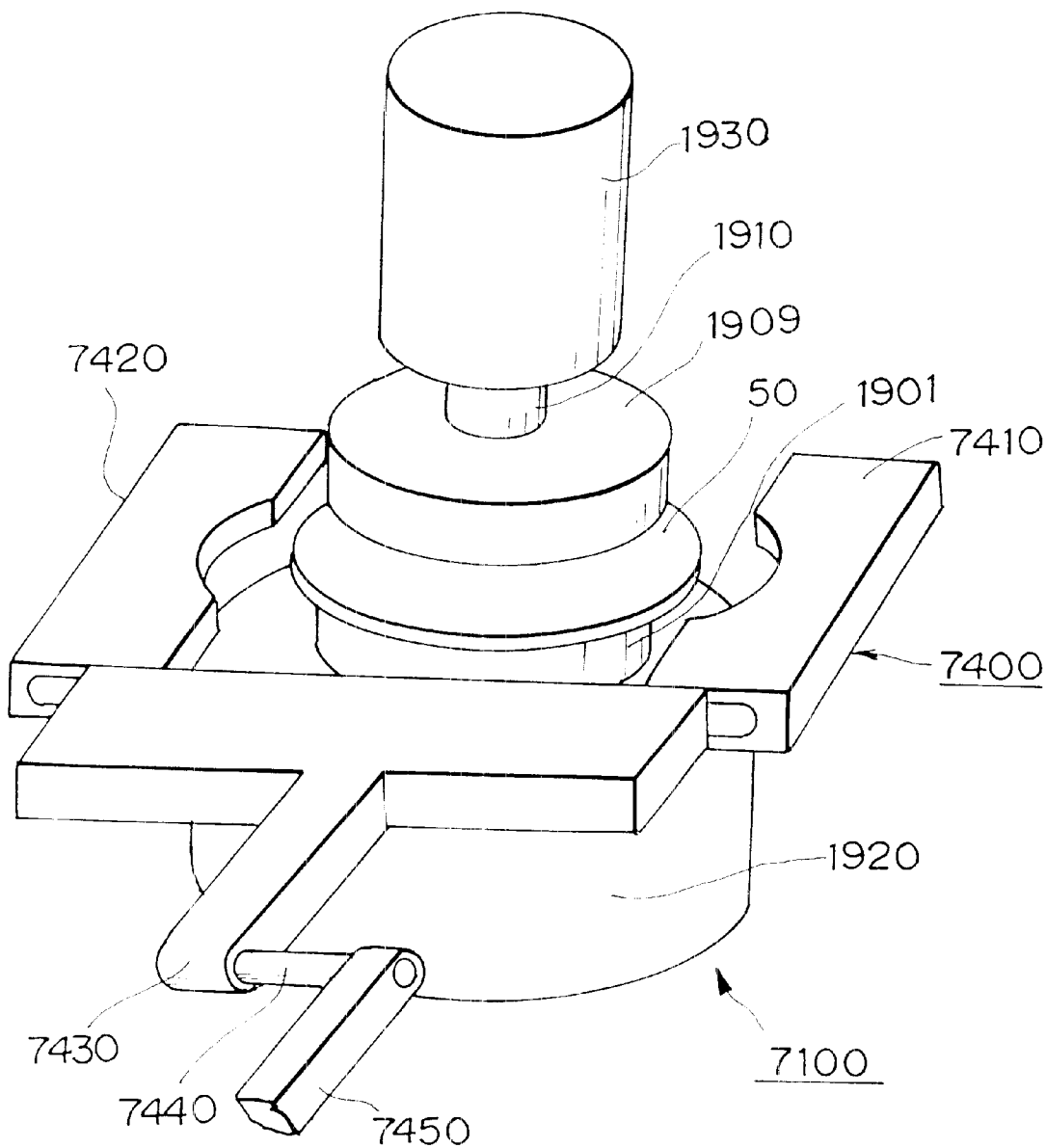
FIG. 4 is a perspective view schematically showing a state wherein the bonded substrate stack held by the holding mechanism located at the centering processing position is centered.

In step S103, the centering apparatus 7400 positions the bonded substrate stack 50 positioned at the centering processing position 7120. FIG. 4 is a perspective view schematically showing a state wherein the bonded substrate stack 50 held by the holding mechanism 7100 located at the centering processing position 7120 is centered.

More specifically, in step S103, as shown in FIG. 4, a driving mechanism 7430 is pivoted by pivoting a rotating shaft 7440 pivotally axially supported by a support mechanism 7450 to locate the bonded substrate :stack 50 between a guide member 7410 and guide member 7420. When the driving mechanism 7430 decreases the interval between the guide member 7410 and guide member 7420, the side surfaces of the guide members 7410 and 7420 abut against the edge portion of the bonded substrate stack 50 to center the bonded substrate stack 50.

In step S104, the turntable 7060 is pivoted through a predetermined angle (72° in this example) clockwise when viewed from the upper side to move the bonded substrate stack centered by the centering apparatus 7400 in step S103 to the separation processing position 7130.

Figure 5:
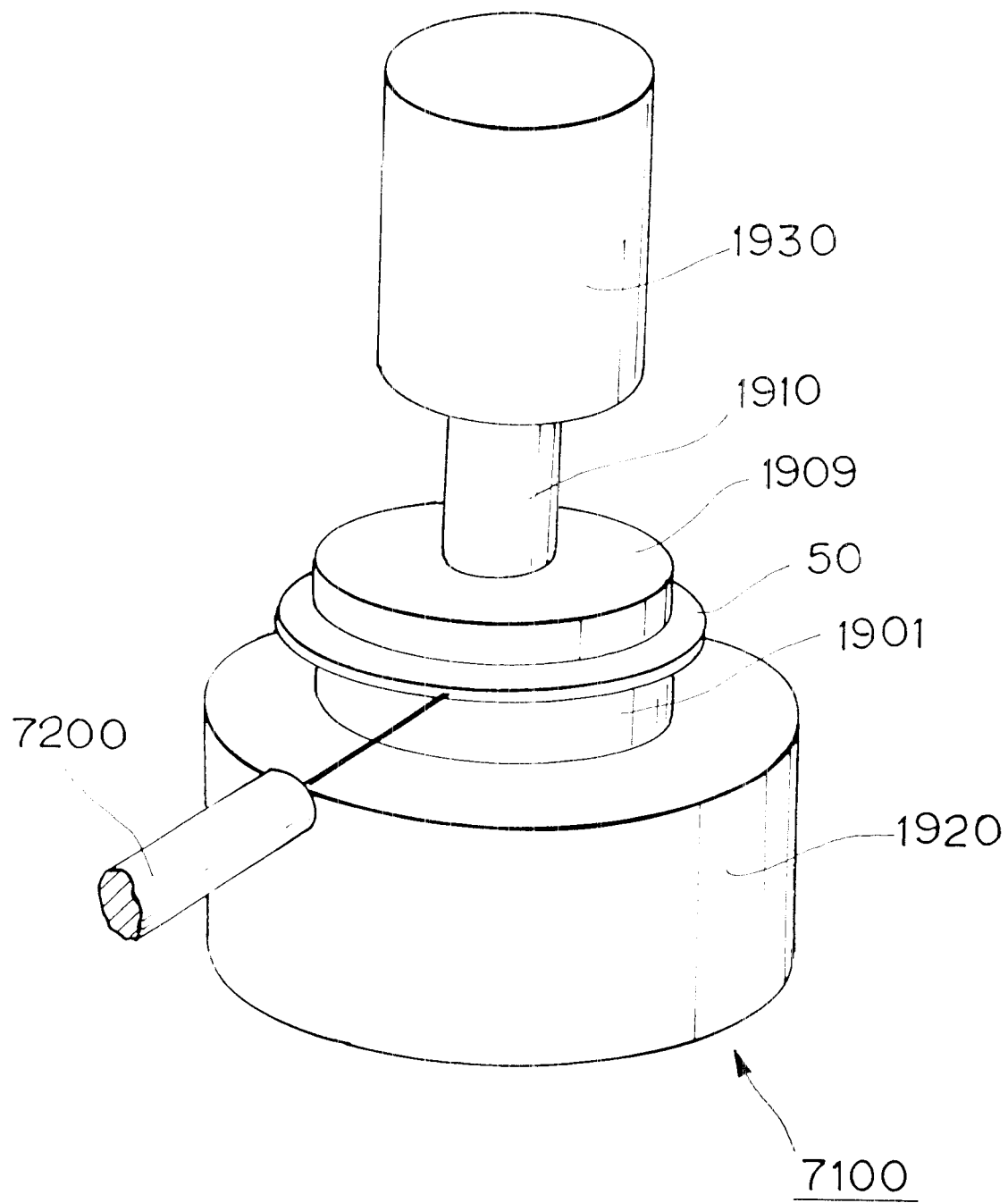
FIG. 5 is a perspective view schematically showing a state wherein the bonded substrate stack held by the holding mechanism located at the separation processing position is separated.

In step S105, the separating apparatus 7200 separates the bonded substrate stack 50 located at the separation processing position at the porous layer. FIG. 5 is a perspective view schematically showing a state wherein the bonded substrate stack 50 held by the holding mechanism 7100 located at the separation processing position 7130 is separated.

More specifically, instep S105, the jet is ejected from the nozzle 7220 of the separating apparatus 7200 toward the porous layer of the bonded substrate stack 50 rotated by the holding mechanism 7100, thereby separating the bonded substrate stack into two, upper and lower substrates. The vacuum chuck mechanisms of the upper and lower substrate holding portions 1909 and 1901 are actuated to move the substrate holding portion 1909 upward, thereby separating the two substrates from each other. Details of separation processing have been described above.

In step S106, the turntable 7060 is pivoted through a predetermined angle (72° in this example) clockwise when viewed from the upper side to move the two substrates separated by the separating apparatus 7200 in step S105 to the cleaning/drying processing position 7140.

Figure 6:
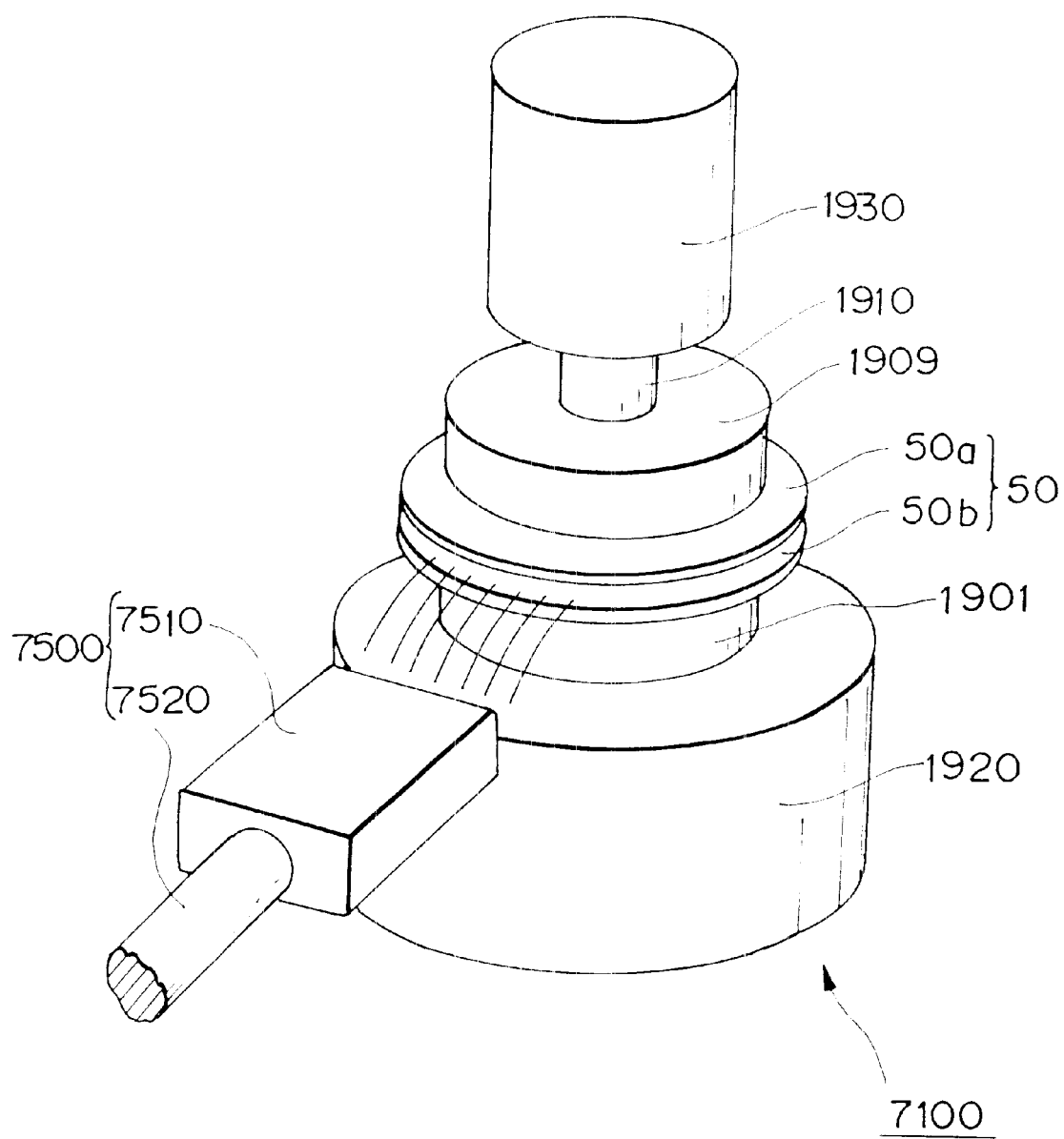
FIG. 6 is a perspective view schematically showing processing of cleaning and drying two substrates located at the cleaning/drying processing position.

In step S107, the cleaning/drying apparatus 7500 cleans and dries the separated substrates. FIG. 6 is a perspective view schematically showing processing of cleaning and drying two substrates located at the cleaning/drying processing position.

More specifically, in step S107, while the substrates are rotated by the holding mechanism 7100, a cleaning solution (e.g., water) supplied through a supply line 7520 is ejected from a cleaning/drying nozzle 7510 to separated substrates 50a and 50b to clean the substrates 50a and 50b. Next, a gas (e.g., air) is ejected from the cleaning/drying nozzle 7510 to the substrates 50a and 50b to dry the substrates 50a and 50b. A cleaning nozzle and a drying nozzle may be separated. When the substrates 50a and 50b are rotated by the holding mechanism 7100 at a high speed, the substrates 50a and 50b can be effectively dried.

In step S108, the turntable,7060 is pivoted through a predetermined angle (72° in this example) clockwise when viewed from the upper side to move the substrates 50a and 50b cleaned/dried in step S107 to the outlet position 7150.

In step S109, the scalar robot 7050 receives the substrate 50a from the upper substrate holding portion 1909 of the holding mechanism 7100 located at the outlet position 7150 and stores the substrate 50a in the second cassette 7031 on the first unloader 7030. The scalar robot 7050 may have a mechanism for rotating the substrate through 180° to turn the substrate. The substrate 50a received from the upper substrate holding portion 1909 may be rotated through 180° by the mechanism and then stored in the second cassette 7031.

In step S110, the scalar robot 7050 receives the substrate 50b from the lower substrate holding portion 1901 of the holding mechanism 7100 located at the outlet position 7150 and stores the substrate 50b in the third cassette 7021 on the second unloader 7020.

Operation of the processing system 7000 for one bonded substrate stack has been described above. In this processing system 7000, operation or processing for the bonded substrate stacks or separated substrates can be parallelly executed at the operation positions 7110 to 7150. More specifically, in the processing system 7000, centering processing by the centering apparatus 7400, separation processing by the separating apparatus 7200, cleaning/drying processing by the cleaning/drying apparatus 7500, and conveyance of the bonded substrate stacks or separated substrates by the scalar robot 7050 can be parallelly executed. According to this processing system, since the operation position can be changed by pivoting the turntable 7060, processing can be rapidly shifted to the next processing. Hence, according to this processing system, the series of processing operations can be performed at a high speed.

In the processing system 7000, for example, a substrate for which separation has failed is stored in the fourth cassette 7011 on the third unloader 7010 by the scalar robot 7050 in accordance with an instruction input from the operator via an operation panel (not shown). Instead of recognizing a separation failure in accordance with an instruction from the operator, a separation state monitor apparatus may be prepared to detect a separation failure.

Second Embodiment

Figure 7:
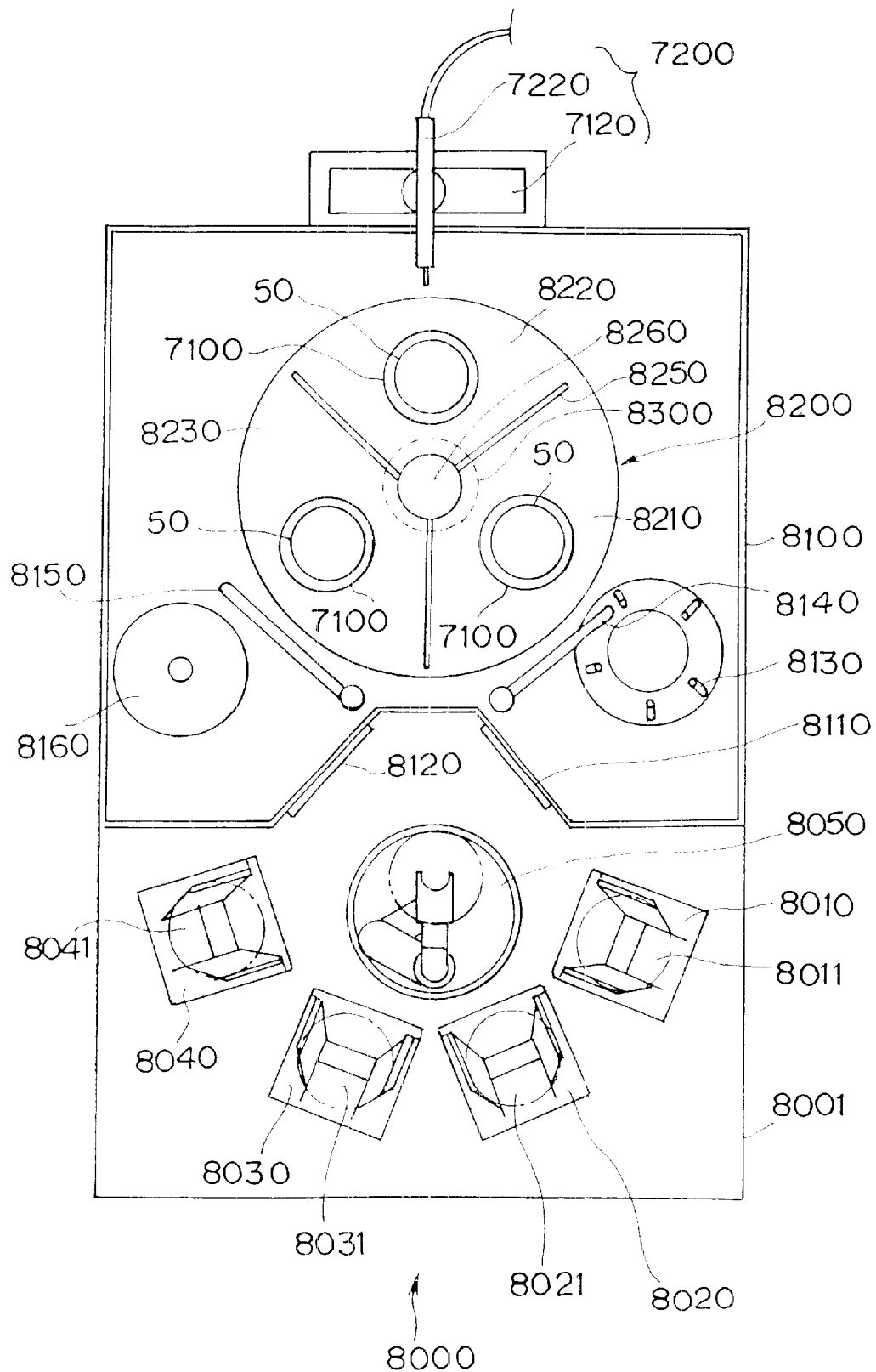
FIG. 7 is a plan view showing the schematic arrangement of a processing system according to the second embodiment of the present invention.

FIG. 7 is a plan view showing the schematic arrangement of a processing system according to the second embodiment of the present invention. A processing system 8000 extracts a bonded substrate stack from a cassette, separates the bonded substrate stack, cleans and dries the separated substrates, classifies the processed substrates, and stores them in cassettes.

The processing system 8000 has a turntable 8200 on which a plurality of holding mechanisms 7100 for holding bonded substrate stacks or separated substrates are mounted at a substantially equal angular interval. The turntable 8200 has partition plates 8250 for partitioning the holding mechanisms 7100.

The turntable 8200 is coupled to the rotating shaft of a motor 8300 disposed underneath. The motor 8300 rotates the turntable 8200 through a predetermined angle to move bonded substrate stacks 50 or separated substrates held by the holding mechanisms 7100 to operation positions 8210 to 8230, respectively.

The operation position 8210 is a position (inlet position) where a bonded substrate stack centered by a centering apparatus 8130 is received from a conveyor robot 8140. At the operation position 8220, the bonded substrate stack 50 is separated at the porous layer by a separating apparatus 7200. The operation position 8230 is a position (outlet position) where separated substrates are transferred from a conveyor robot 8150 to a cleaning/drying apparatus 8160.

The centering apparatus 8130, turntable 8200, cleaning/drying apparatus 8160, and conveyor robots 8140 and 8150 are arranged in a chamber 8100. The chamber 8100 has two shutters 8110 and 8120. A scalar robot 8050 transfers the bonded substrate stack to the centering apparatus 8130 while keeping the shutter 8110 open, and receives a cleaned/dried substrate from the cleaning/drying apparatus 8160 while keeping the shutter 8120 open.

The processing system 8000 has a loader 8010, first unloader 8020, second unloader 8030., and third unloader 8040. Before processing, a first cassette 8011 storing one or a plurality of bonded substrate stacks is placed on the loader 8010. Before processing, an empty second cassette 8021 is placed on the first unloader 8020, an empty third cassette 8031 is placed on the second unloader 8030, and an empty fourth cassette 8041 is placed on the third unloader 8040.

In this embodiment as well, the constituent elements of the processing system 8000 may be put into units, and the units may be connected in use to build the processing system, as in the first embodiment.

The scalar robot 8050 rotates the robot hand about a predetermined rotating shaft and moves the robot hand close to or away from the rotating shaft to convey the bonded substrate stack or separated substrate.

FIG. 11 is a flow chart showing the flow of processing for one bonded substrate stack in the processing system 8000. First, the first cassette 8011 storing bonded substrate stacks to be processed is placed at a predetermined position on the loader 8010 manually or automatically. The empty second cassette 8021, third cassette 8031, and fourth cassette 8041 are placed on the first unloader 8020, second unloader 8030, and third unloader 8040, respectively.

In this embodiment, the second cassette 8021 is used to store upper separated substrates, the third cassette 8031 is used to store lower separated substrates, and the fourth cassette 8041 is used to store bonded substrate stacks (or separated substrates) for which separation has failed.

The first cassette 8011 is placed on the loader 8010 such that the stored bonded substrate stacks become horizontal. The second cassette 8021, third cassette 8031, and fourth cassette 8041 are placed on the first unloader 8020, second unloader 8030, and third unloader 8040, respectively, such that the substrates can be stored horizontally.

In step S201, the shutter 8110 is opened, and the scalar robot 8050 extracts the bonded substrate stack 50 from the first cassette 8011 on the loader 8010 and transfers the bonded substrate stack to the centering apparatus 8130. In step S202, the centering apparatus 8130 centers the bonded substrate stack. In step S203, the conveyor robot 8140 transfers the centered bonded substrate stack to the holding mechanism 7100 located at the operation position 8210.

In step S204, the turntable 8200 is pivoted through a predetermined angle (120° in this example) counterclockwise when viewed from the upper side to move the bonded substrate stack transferred to the holding mechanism 7100 located at the operation position 8210 in step S203 to the separation processing position 8220.

In step S205, the separating apparatus 7200 separates the bonded substrate stack 50 located at the separation processing position 8220 at the porous layer. FIG. 5 is a perspective view schematically showing a state wherein the bonded substrate stack 50 held by the holding mechanism 7100 located at the separation processing position 8220 is separated.

More specifically, in step S205, the jet is ejected from a nozzle 7220 of the separating apparatus 7200 toward the porous layer of the bonded substrate stack 50 rotated by the holding mechanism 7100, thereby separating the bonded substrate stack into two, upper and lower substrates. The vacuum chuck mechanisms of upper and lower substrate holding portions 1909 and 1901 are actuated to move the substrate holding portion 1909 upward, thereby separating the two substrates from each other. Details of separation processing have been described above.

In step S206, the turntable 8200 is pivoted through a predetermined angle (120° in this example) counterclockwise when viewed from the upper side to move the substrates separated in step S205 to the operation position 8230.

In step S207, the conveyor robot 8150 transfers the upper separated substrate from the holding mechanism 7100 at the operation position 8230 to the cleaning/drying apparatus 8160. Instep S208, the cleaning/drying apparatus 8160 cleans and dries the upper substrate. In step S209, the shutter 8120 is opened, and the scalar robot 8050 receives the upper substrate from the cleaning/drying apparatus 8160 and stores the substrate in the second cassette 8021 on the first unloader 8020. The scalar robot 8050 may have a mechanism for rotating the substrate through 180° to turn the substrate. The upper substrate received from the cleaning/drying apparatus 8160 may be rotated through 180° by the mechanism and then stored in the second cassette 8021.

In step S210, the conveyor robot 8150 transfers the lower separated substrate from the holding mechanism 7100 at the operation position 8230 to the cleaning/drying apparatus 8160. In step S211, the cleaning/drying apparatus 8160 cleans and dries the lower substrate. In step S212, the shutter 8120 is opened, and the scalar robot 8050 receives the lower substrate from the cleaning/drying apparatus 8160 and stores the substrate in the third cassette 8031 on the second unloader 8030.

Operation of the processing system 8000 for one bonded substrate stack has been described above. In this processing system 8000, centering processing by the centering apparatus 8130, separation processing by the separating apparatus 7200, and cleaning/drying processing by the cleaning/drying apparatus 8160 can be parallelly executed. According to this processing system, the operation position can be rapidly changed by pivoting the turntable 8200. Hence, according to this processing system, the series of processing operations can be performed at a high speed.

In the processing system 8000, for example, a substrate for which separation has failed is stored in the fourth cassette 8041 on the third unloader 8040 by the scalar robot 8050 in accordance with an instruction input from the operator via an operation panel (not shown). Instead of recognizing a separation failure in accordance with an instruction from the operator, a separation state monitor apparatus may be prepared to detect a separation failure.

Another Structure of Robot Hand of Scalar Robot

Figure 12A:
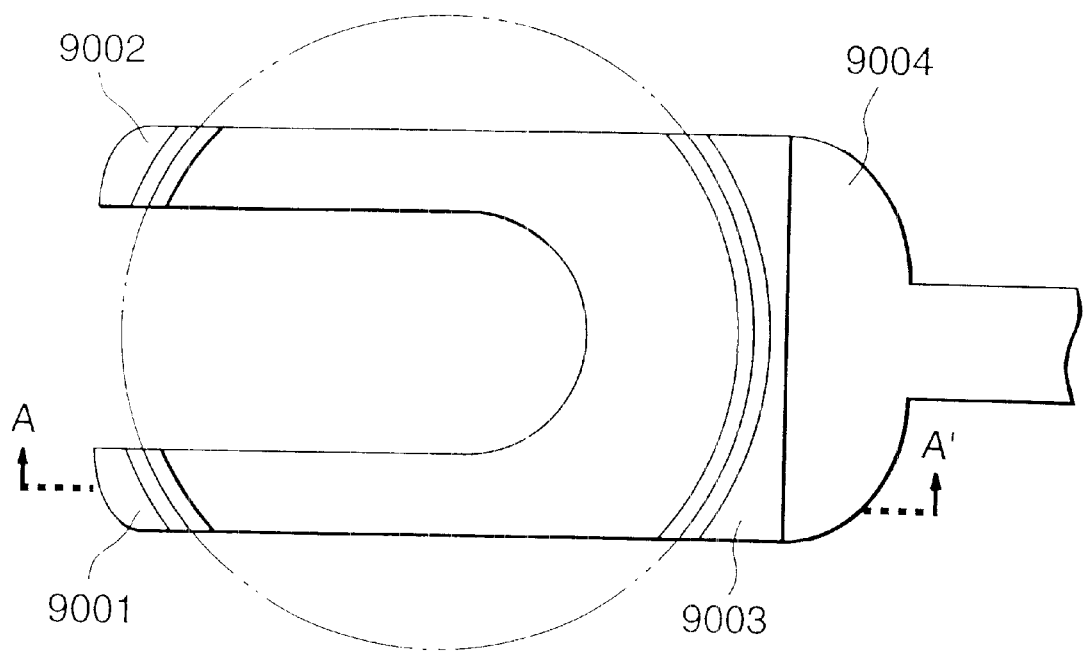
FIGS. 12A and 12B are views showing another structure of a scalar robot.
Figure 12B:
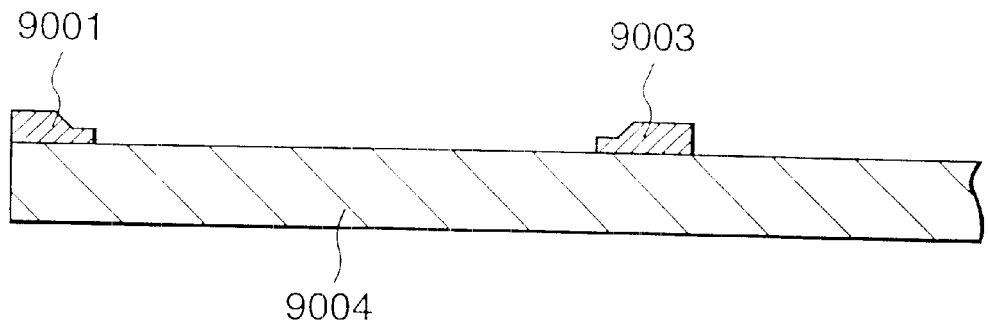

Another structure of the robot hand of the scalar robot 7050 will be described next. FIGS. 12A and 12B are views showing another structure of the robot hand of the scalar robot 7050. FIG. 12A is a plan view, and FIG. 12B is a sectional view taken along a line A–A' in FIG. 12A. The robot hand shown in FIGS. 12A and 12B has a U-shaped main body 9004 and holding portions 9001 to 9003 for holding the end portions of a bonded substrate stack or separated substrate. The holding portions 9001 to 9003 are preferably formed from, e.g., PTFE.

The robot hand with this structure comes into contact with only the end portion of a bonded substrate stack or separated substrate. Hence, the surfaces of the bonded substrate stack or separated substrate are rarely damaged.

The robot hand with this structure comes into contact with only the end portion of a separated substrate. Hence, independently of whether the separated surface is directed to the upper or lower side, the substrate surfaces are rarely damaged even when the separated substrate is held from the lower side.

The robot hand with this structure holds a bonded substrate stack or separated substrate while regulating the bonded substrate stack or separated substrate from moving in the planar direction. For this reason, the bonded substrate stack or separated substrate can be prevented from dropping.

The robot hand with this structure may have a chuck mechanism at one or all of the holding portions 9001 to 9003. In this case, drop of a bonded substrate stack or separated substrate can be more effectively prevented. In addition, for example, a substrate can be supported from the upper side.

The robot hand with this structure may have a mechanism for rotating the main body 9004 which is chucking a separated substrate through 180° to turn the substrate.

According to the present invention, for example, since the operation position can be changed by pivoting the turntable, the series of processing operations can be executed at a high speed.

The present invention is not limited to the above embodiments and various changes and modifications can be made within the spirit and scope of the present invention. Therefore, to apprise the public of the scope of the present invention, the following claims are made.

What is claimed is:

1. A processing system for processing a sample, comprising:
   a turntable on which holding mechanisms for holding samples are mounted at a substantially equal angular interval, wherein said holding mechanisms hold the samples by sandwiching the samples from upper and lower sides, each of said holding mechanisms comprising a shift prevention member;
   a driving mechanism for pivoting said turntable through a predetermined angle to move the samples held by said holding mechanisms to operation positions; and
   at least one processing apparatus for processing the sample held by said holding mechanism at a predetermined operation position.

2. The system according to claim 1, wherein the operation positions include an inlet position at which the sample for which processing is to be started is received, and an outlet position at which the processed sample is transferred.

3. The system according to claim 2, further comprising a conveyor mechanism for transferring the sample to be processed to said holding mechanism located at the operation position as the inlet position and receiving the processed sample from said holding mechanism located at the operation position as the outlet position.

4. The system according to claim 3, wherein said conveyor mechanism transfers a plate-like sample in a horizontal state to said holding mechanism located at the inlet position and receives the processed plate-like sample in the horizontal state from said holding mechanism located at the outlet position.

5. The system according to claim 4, wherein said conveyor mechanism comprises a scalar robot.

6. The system according to claim 5, wherein said holding mechanism has a lower holding mechanism for holding the plate-like sample from a lower side.

7. The system according to claim 5, wherein said holding mechanism has a lower holding mechanism for holding the plate-like sample from a lower side, and an upper holding mechanism for holding the plate-like sample from an upper side.

8. The system according to claim 2, further comprising a centering apparatus for centering the sample, and a conveyor mechanism for receiving the sample centered by said centering apparatus and transferring the sample to said holding mechanism located at the inlet position.

9. The system according to claim 2, further comprising
a cleaning apparatus for cleaning the sample, and
a conveyor mechanism for receiving the sample held by said holding mechanism located at the outlet position and transferring the sample to said cleaning apparatus.

10. The system according to claim 2, further comprising
a cleaning/drying apparatus for cleaning and drying the sample, and
a conveyor mechanism for receiving the sample held by said holding mechanism located at: the outlet position and transferring the sample to said cleaning/drying apparatus.

11. The system according to claim 2, further comprising
a centering apparatus for centering the sample,
a first conveyor mechanism for receiving the sample centered by said centering apparatus and transferring the sample to said holding mechanism located at the inlet position,
a cleaning apparatus for cleaning the sample, and
a second conveyor mechanism for receiving the sample held by said holding mechanism located at the outlet position and transferring the sample to said cleaning apparatus.

12. The system according to claim 11, further comprising a third conveyor mechanism for transferring the sample to said centering apparatus and receiving the sample from said cleaning apparatus.

13. The system according to claim 2, further comprising
a centering apparatus for centering the sample,
a first conveyor mechanism for receiving the sample centered by said centering apparatus and transferring the sample to said holding mechanism located at the inlet position,
a cleaning/drying apparatus for cleaning and drying the sample, and
a second conveyor mechanism for receiving the sample held by said holding mechanism located at the outlet position and transferring the sample to said cleaning/drying apparatus.

14. The system according to claim 13, further comprising a third conveyor mechanism for transferring the sample to said centering apparatus and receiving the sample from said cleaning/drying apparatus.

15. The system according to claim 2, further comprising an apparatus for processing the sample before the sample is transferred to said holding mechanism located at the inlet position.

16. The system according to claim 2, further comprising an apparatus for processing the sample after the sample is received from said holding mechanism located at the outlet position.

17. The system-according to claim 1, wherein the sample to be processed has a separation layer, and said at least one processing apparatus comprises a separating apparatus for separating the sample at the separation layer.

18. The system according to claim 17, wherein said separating apparatus ejects a stream of a fluid toward the separation layer of the sample held by said holding mechanism located at the operation position at which the sample is separated, thereby separating the sample at the separation layer.

19. The system according to claim 18, wherein said holding mechanism has a driving source for rotating the sample about an axis perpendicular to the separation layer, and said separating apparatus separates the sample rotated by said driving source.

20. The system according to claim 17, wherein said at least one processing apparatus comprises a cleaning apparatus for cleaning a sample separated by said separating apparatus.

21. The system according to claim 20, wherein said cleaning apparatus cleans the sample held,by said holding mechanism located at the operation position for cleaning processing.

22. The system according to claim 17, wherein said at least one processing apparatus comprises a cleaning/drying apparatus for cleaning and drying a sample separated by said separating apparatus.

23. The system according to claim 22, wherein said cleaning/drying apparatus cleans and dries the sample held by said holding mechanism located at the operation position for cleaning/drying processing.

24. The system according to claim 17, wherein the separation layer is a layer having a fragile structure.

25. The system according to claim 24, wherein the layer having the fragile structure is a porous layer.

26. The system according to claim 24, wherein the layer having the fragile structure is a microcavity layer.

27. The system according to claim 17, wherein the sample to be processed is formed by bonding a first substrate and a second substrate and has a layer having a fragile structure as the separation layer.

28. The system according to claim 1, wherein said at least one processing apparatus comprises a centering apparatus for centering the sample.

29. The system according to claim 28, wherein said centering apparatus centers the sample held by said holding mechanism located at the operation position for centering processing.

30. The system according to claim 1, wherein processing operations are parallelly executed at the operation positions.

31. The system according to claim 1, wherein the sample to be processed is a semiconductor substrate.

32. The system according to claim 1, wherein the sample to be processed is formed by forming a porous layer on a surface of a first semiconductor substrate, forming an unporous layer on the porous layer, and bonding a second substrate to the unporous layer.

* * * * *

UNITED STATES PATENT AND TRADEMARK OFFICE
CERTIFICATE OF CORRECTION

PATENT NO. : 6,629,539 B1  
DATED : October 7, 2003  
INVENTOR(S) : Kazutaka Yanagita et al.

It is certified that error appears in the above-identified patent and that said Letters Patent is hereby corrected as shown below:

Title page,  
Item [56], References Cited, OTHER PUBLICATIONS, " "Silicon-On-Insulator by Wafer Bonding: A Review", W.P. Maszara, *Journal of Electrochemical Society*, vol. 138, pp. 314-347, 1991." should read -- Silicon-On-Insulator by Wafer Bonding: A Review", W.P. Maszara, *Journal of Electrochemical Society*, vol. 138, pp. 341-347, 1991. --

Column 1,  
Line 39, "the, sapphire" should read -- the sapphire --  
Line 51, "the!substrate" should read -- the substrate --

Column 2,  
Line 36, "is to: be" should read -- is to be --  
Line 45, "transfers a, plate-like" should read -- transfers a plate-like --

Column 3,  
Line 44, "apparatus: for" should read -- apparatus for --

Column 5,  
Line 35, "layer 15 maybe" should read -- layer 15 may be --  
Line 56, "(10'+20)" should read -- (10"+20) --

Column 7,  
Line 49, "lupper" should read -- upper --

Column 9,  
Line 16, "scalar robot 7056," should read -- scalar robot 7050, --

Column 10,  
Line 24, "instep S105," should read -- in step S105, --  
Line 54, "turntable,7060" should read -- turntable 7060 --

Column 12,  
Line 2, "8030.," should read -- 8030, --

UNITED STATES PATENT AND TRADEMARK OFFICE
CERTIFICATE OF CORRECTION

PATENT NO. : 6,629,539 B1
DATED : October 7, 2003
INVENTOR(S) : Kazutaka Yanagita et al.

It is certified that error appears in the above-identified patent and that said Letters Patent is hereby corrected as shown below:

Column 13,
Line 8, "Instep S208," should read -- In step S208, --

Column 15,
Line 58, "system-according" should read -- system according --

Column 16,
Line 20, "held,by" should read -- held by --

Signed and Sealed this

Sixth Day of April, 2004

JON W. DUDAS
*Acting Director of the United States Patent and Trademark Office*